US012642019B2

(12) United States Patent
Liu et al.

(10) Patent No.: US 12,642,019 B2
(45) Date of Patent: May 26, 2026

(54) PLASMA PROCESSING METHOD

(71) Applicant: HITACHI HIGH-TECH CORPORATION, Tokyo (JP)

(72) Inventors: Jiahui Liu, Tokyo (JP); Hayato Watanabe, Tokyo (JP); Satoshi Une, Tokyo (JP); Mafumi Sato, Tokyo (JP); Yuya Yamamoto, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 18/279,692

(22) PCT Filed: Apr. 18, 2022

(86) PCT No.: PCT/JP2022/017986
§ 371 (c)(1),
(2) Date: Aug. 31, 2023

(87) PCT Pub. No.: WO2023/203591
PCT Pub. Date: Oct. 26, 2023

(65) Prior Publication Data
US 2025/0095981 A1      Mar. 20, 2025

(51) Int. Cl.
*H10P 14/692*          (2026.01)
*H01J 37/32*           (2006.01)
(Continued)

(52) U.S. Cl.
CPC .... *H10P 14/6927* (2026.01); *H01J 37/32146* (2013.01); *H10P 50/283* (2026.01);
(Continued)

(58) Field of Classification Search
None
See application file for complete search history.

(56) References Cited

U.S. PATENT DOCUMENTS 5,352,324 A    10/1994  Gotoh et al.
6,355,581 B1    3/2002  Vassiliev et al.
(Continued)

FOREIGN PATENT DOCUMENTS

JP      H11-111699 A    4/1999
JP      2003-083720 A   3/2003
(Continued)

OTHER PUBLICATIONS

Search Report mailed Jul. 12, 2022 in International Application No. PCT/JP2022017986.

(Continued)

*Primary Examiner* — Shamim Ahmed
(74) *Attorney, Agent, or Firm* — Miles & Stockbridge, P.C.

(57)          ABSTRACT
A plasma processing method for preventing a protective film from being deposited in a direction parallel to a substrate surface to block an opening of a mask pattern and improving pattern processing even in a narrow space, by plasma-etching an etching target film using a protective film formed on a mask, and forming the protective film on the mask using plasma generated by a mixed gas of a silicon element-containing gas, an oxygen element-containing gas, a nitrogen element-containing gas, and a hydrogen element-containing gas, in which the hydrogen element-containing gas is $H_2$ gas, HBr gas, or $CH_4$ gas. The oxygen element-containing gas is $O_2$ gas, CO gas, $CO_2$ gas, COS gas, or $SO_2$ gas.

5 Claims, 10 Drawing Sheets

(51) Int. Cl.
    *H10P 50/00*        (2026.01)
    *H10P 50/28*        (2026.01)

(52) U.S. Cl.
    CPC ........ *H10P 50/73* (2026.01); *H01J 2237/332* (2013.01); *H01J 2237/334* (2013.01)

(56)            References Cited

U.S. PATENT DOCUMENTS

| | | | |
|---|---|---|---|
| 8,124,537 | B2 | 2/2012 | Lee et al. |
| 9,530,666 | B2 | 12/2016 | Mizuno et al. |
| 10,157,750 | B2 | 12/2018 | Terakura et al. |
| 11,462,416 | B2 | 10/2022 | Matsui et al. |
| 2007/0026677 | A1* | 2/2007 | Ji ........................ H01L 21/0337 438/689 |
| 2007/0238305 | A1 | 10/2007 | Delgadino et al. |
| 2008/0020584 | A1 | 1/2008 | Hirotsu et al. |
| 2010/0330805 | A1 | 12/2010 | Doan et al. |
| 2011/0139748 | A1 | 6/2011 | Donnelly et al. |
| 2011/0253672 | A1 | 10/2011 | Kamibayashi et al. |
| 2012/0003838 | A1 | 1/2012 | Ookuma et al. |
| 2012/0208369 | A1* | 8/2012 | Nishizuka ......... H01J 37/32192 438/724 |
| 2013/0023125 | A1 | 1/2013 | Singh |
| 2013/0115772 | A1 | 5/2013 | Oishi et al. |
| 2013/0344702 | A1* | 12/2013 | Nishizuka ........... H01L 21/3065 438/724 |
| 2015/0064914 | A1 | 3/2015 | Kong et al. |
| 2015/0099366 | A1 | 4/2015 | Takeda et al. |
| 2015/0221518 | A1 | 8/2015 | Terakura et al. |
| 2015/0235861 | A1 | 8/2015 | Mizuno et al. |
| 2016/0005602 | A1 | 1/2016 | Yoo et al. |
| 2016/0099187 | A1 | 4/2016 | Lian |
| 2016/0379841 | A1 | 12/2016 | Hidaka et al. |
| 2017/0178920 | A1 | 6/2017 | Dole et al. |
| 2018/0068862 | A1 | 3/2018 | Terakura et al. |
| 2018/0233350 | A1 | 8/2018 | Tois et al. |
| 2018/0269118 | A1 | 9/2018 | Matsui et al. |
| 2019/0019689 | A1 | 1/2019 | Kihara et al. |
| 2019/0139781 | A1 | 5/2019 | Katsunuma |
| 2019/0221441 | A1 | 7/2019 | Jiang et al. |
| 2019/0362984 | A1* | 11/2019 | Katsunuma ....... H01L 21/02238 |
| 2020/0273705 | A1 | 8/2020 | Singh et al. |
| 2020/0335354 | A1 | 10/2020 | Matsui et al. |
| 2021/0057229 | A1 | 2/2021 | Ohori et al. |
| 2022/0005688 | A1* | 1/2022 | Fung .................. H01L 21/0337 |
| 2022/0238348 | A1* | 7/2022 | Miyashita ......... H01L 21/31144 |

FOREIGN PATENT DOCUMENTS

| | | | |
|---|---|---|---|
| JP | 2005-294348 | A | 10/2005 |
| JP | 2007-258586 | A | 10/2007 |
| JP | 2008-060566 | A | 3/2008 |
| JP | 2009-135478 | A | 6/2009 |
| JP | 2011-228436 | A | 11/2011 |
| JP | 2012-529777 | A | 11/2012 |
| JP | 2013-239757 | A | 11/2013 |
| JP | 2014-007370 | A | 1/2014 |
| JP | 2014-232825 | A | 12/2014 |
| JP | 2015-144158 | A | 8/2015 |
| JP | 2017-011167 | A | 1/2017 |
| JP | 2017-212331 | A | 11/2017 |
| JP | 2018-137435 | A | 8/2018 |
| JP | 2018-157048 | A | 10/2018 |
| JP | 2018-160689 | A | 10/2018 |
| JP | 2019-087626 | A | 6/2019 |
| JP | 2021-034483 | A | 3/2021 |
| KR | 10-2012-0002900 | A | 1/2012 |
| KR | 10-2017-0000791 | A | 1/2017 |
| KR | 10-2018-0101204 | A | 9/2018 |
| KR | 10-2021-0023738 | A | 3/2021 |
| WO | 2014046083 | A1 | 3/2014 |
| WO | 2020122259 | A1 | 6/2020 |

OTHER PUBLICATIONS

Written Opinion mailed Jul. 12, 2022 in International Application No. PCT/JP2022017986.

Office Action mailed Aug. 2, 2023 in Taiwanese Application No. 112106738.

Office Action mailed Aug. 27, 2018 in Korean Application No. 10-2017-7020315.

Office Action mailed Aug. 30, 2018 in Korean Application No. 10-2018-7015807.

Search Report mailed Mar. 9, 2021 in International Application No. PCT/JP2021/046976.

Search Report mailed Mar. 10, 2020 in International Application No. PCT/JP2019/049420.

Dominik Metzler et al "Fluorocarbon assisted atomic layer etching of SiO2 using cyclic Ar/C4F8 plasma" Journal of Vacuum Science & Technology, A32, Mar. 2014 (5 pages).

Notice of Allowance mailed Aug. 29, 2018 in U.S. Appl. No. 15/558,045.

Notice of Allowance mailed Jun. 3, 2022 in U.S. Appl. No. 16/957,347.

Notice of Allowance mailed Jan. 28, 2022 in U.S. Appl. No. 16/957,347.

Office Action mailed Jun. 18, 2021 in U.S. Appl. No. 16/957,347.

Office Action mailed Oct. 29, 2024 in Korean Application No. 10-2023-7025601.

Office Action mailed Jun. 25, 2025 in Korean Application No. 10-2023-7025601.

* cited by examiner

PLASMA PROCESSING METHOD

TECHNICAL FIELD

The present invention relates to a plasma processing method.

BACKGROUND ART

In a semiconductor device manufacturing process, a plasma processing method is known in which an etching target film on a substrate is etched using a patterned mask including an oxide film or a nitride film formed on the substrate. Since the patterned mask may be used for other purposes without being removed after the etching process, it is necessary not to damage the mask during etching. Therefore, a method or depositing a protective film on the patterned mask and then performing etching is used. Therefore, such plasma processing method includes a step of forming the protective film on the mask and an etching step.

As a method for performing etching using the mask on which the protective film is deposited, an etching method disclosed in PTL 1 is proposed. The invention disclosed in PTL 1 is an etching method for etching a silicon carbide substrate placed on a base in a processing chamber, and includes: heating the silicon carbide substrate to 200° C. or higher; supplying a silicon-based gas containing at least $SiF_4$ gas or $SiCl_4$ gas and a processing gas containing oxygen gas or nitrogen gas into the processing chamber to generate plasma; and forming a silicon oxide film or a silicon nitride film as a protective film on the silicon carbide substrate and etching the silicon carbide substrate.

CITATION LIST

Patent Literature

PTL 1: JP2013-239757A

SUMMARY OF INVENTION

Technical Problem

A case occurs in which, if a space interval between mask patterns is narrowed due to reduction of a cell size, miniaturization of a line-and-space, and the like, when a protective film is deposited using plasma, the protective film grown in a lateral direction (plane direction) of a substrate may block an opening of the mask pattern. Therefore, even if etching is to be performed by the plasma, the plasma is prevented from entering the space by the protective film deposited in the opening, and therefore the etching cannot be sufficiently performed on an etching target film.

In the etching technique of PTL 1, recognition of the problem that a space between mask patterns is blocked by the protective film is not disclosed either.

The invention is made to solve the above problem, and an object of the invention is to provide a plasma processing method capable of preventing a protective film from being deposited in a direction parallel to a substrate surface to block an opening or a mask pattern and improving pattern processing even in a narrow space.

Solution to Problem

In order to solve the above problem, one typical plasma processing method according to the invention is a plasma processing method for plasma-etching an etching target film using a protective film formed on a mask, and includes a step of forming the protective film on the mask using plasma generated by a mixed gas of a silicon element-containing gas, an oxygen element-containing gas, a nitrogen element-containing gas, and a hydrogen element-containing gas.

Advantageous Effects of Invention

The invention prevents a protective film from being deposited in a direction parallel to a substrate surface to block an opening of a mask pattern and improves pattern processing even in a narrow space.

Problems, configurations, and effects other than those described above will become apparent from the following description of embodiments.

DESCRIPTION OF EMBODIMENTS

Figure 1:
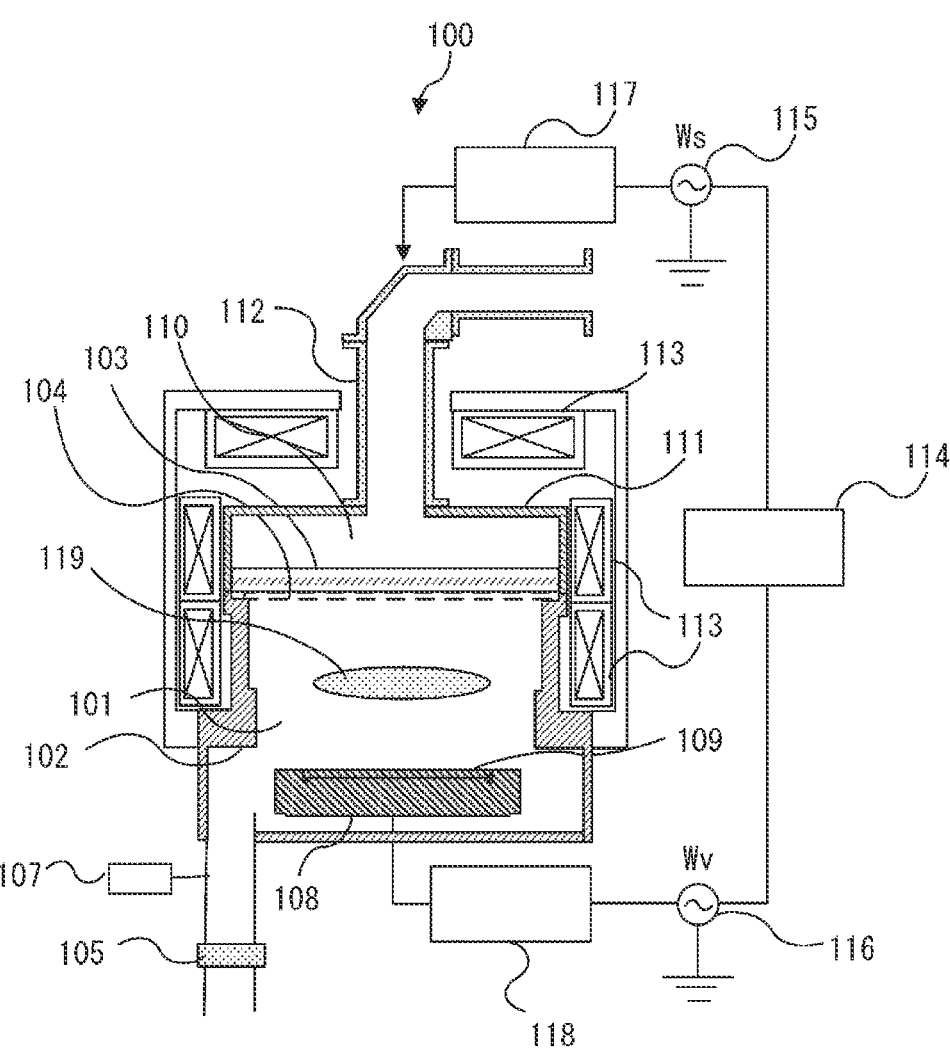
FIG. 1 is a schematic: view of a plasma processing device by which a plasma processing method according to a first embodiment of the invention is performed.

Hereinafter, embodiments according to the invention will be described with reference to the drawings. The invention is not limited to the embodiments. Further, in descriptions of the drawings, the same parts are designated by the same reference numerals.

In the embodiments according to the invention, as an example, a mask is made of silicon nitride or silicon oxide. A mask pattern is formed with spaces separated at a predetermined interval.

In addition, in the embodiments according to the invention, for example, a silicon nitride film is formed as an etching target film on a processing target substrate (hereinafter, also referred to as a "sample"), and the above mask is formed on a surface of the silicon nitride film. Therefore, the silicon nitride film as the etching target film is etched according to a pattern of the mask. In the present disclosure, unless otherwise specified, a surface means a surface parallel to a surface of a processing target film such as a silicon nitride film.

In the embodiments according to the invention, time modulation of power means that an on state and an off state of output of the power are periodically performed. Hereinafter, the time modulation is also referred to as "pulse modulation".

<Example of Related Art>

Figure 6:
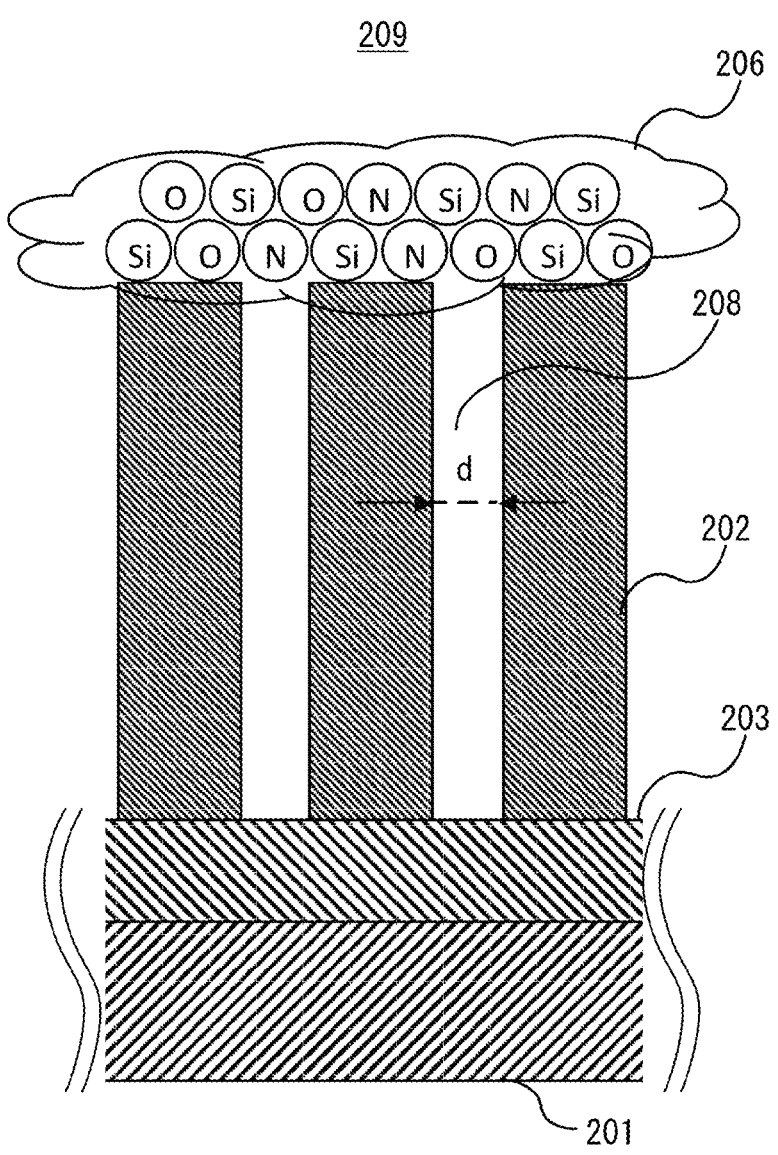
FIG. 6 is a schematic cross-sectional view of a processing target substrate when a protective film forming s is applied in related art.

A case where the example of the related art is applied will be described with reference to FIG. 6. FIG. 6 is a schematic cross-sectional view of a processing target substrate when a protective film forming step is applied in related art. In a processing target substrate 209, a silicon nitride film 203 as an etching target film is formed on a wafer substrate 201, and patterns of a mask 202 are formed on a surface of the silicon nitride film 203.

Next, in order to form a protective film 206 on an upper surface of the mask 202, $SiCl_4$ gas, $N_2$ gas, $O_2$ gas, and He gas are used as a processing gas, an oxide or nitride of silicon is generated in plasma, and the protective film 206 is deposited on the upper surface of the mask 202.

He gas used in the invention functions to adjust distribution so that the protective film 206 deposited in a wafer surface is uniformly distributed at a central portion and a peripheral portion of the wafer surface, and does not affect properties of the protective film 206. In a protective film forming step in related art, the protective film 206 is deposited not only on the upper surface of the mask 202 but also in openings 208 and thus blocks the pattern.

Therefore, when an etching step is continuously performed, the silicon nitride film 203 cannot be etched as desired. When an interval d of the openings 208 of the pattern of the mask 202 is a space at least smaller than 15 nm, a phenomenon is confirmed in which an oxide or the like is deposited and causes clogging.

First Embodiment

FIG. 1 is a schematic view of a plasma processing device 100 by which a plasma processing method according to the embodiment of the invention is performed. The plasma processing device 100 is a device that generates plasma using microwave electron cyclotron resonance (ECR) and performs plasma processing by the generated plasma.

<Configuration of Device>

A processing chamber 101 is a space surrounded by a chamber 102 and a top plate 103. The processing chamber 101 is provided with a shower plate 104 for introducing a processing gas inside. The shower plate 104 is formed with holes, and the processing gas is introduced through the holes. Examples of a material of the shower plate 104 include quartz. A vacuum exhaust pump 105 is controlled by a control unit 107. The vacuum exhaust pump 105 evacuates the inside of the processing chamber 101 to a high vacuum. A sample stage 108 includes an electrode. By electrostatically absorbing a processing target substrate 109 using the electrode, the placed processing target substrate 109 is held. In addition, the electrode of the sample stage 108 is supplied with bias power as described later. Examples of a material of the sample stage 108 include aluminum or titanium.

A cavity resonance portion 110 is a space surrounded by the top plate 103 and a chamber 111. Examples of a material of the top plate 103 include quartz. A waveguide 112 is connected to the cavity resonance portion 110. The waveguide 112 includes a linear waveguide in which a waveguide is laid linearly and a corner waveguide in which a waveguide is bent by 90 degrees.

Central axes of a linear waveguide portion of the waveguide 112 connected to an opening of the cavity resonance portion 110, the processing chamber 101, the sample stage 108, and the processing target substrate 109 coincide with each other. Magnetic field generating coils 113 for generating a magnetic field is disposed around the processing chamber 101 and the cavity resonance portion 110.

<Plasma Generation>

A control unit 114 controls a source power supply 115 and a bias power supply 116. The processing target substrate 109 is etched by setting source power for generating plasma and bias power to be supplied to the processing target substrate 109. Hereinafter, the source power and the bias power are also simply referred to as radio frequency power.

The source power supply 115 generates an electromagnetic wave via a matching device 117. The source power supply 115 has a CW mode [Continuous Wave] in which power oscillation is continuously turned on and a time modulation mode [Time Modulation] in which on/off of the power oscillation is periodically repeated on a millisecond order. In the invention, the electromagnetic wave is a microwave of 2.45 GHz. In the first embodiment, the source power supply 115 outputs the source power in the CW mode. The source power is power for generating plasma. The electromagnetic wave generated by the source power supply 115 propagates through the waveguide 112 and is introduced into the processing chamber 101 via the cavity resonance portion 110, the top plate 103, and the shower plate 104. Plasma 119 is generated from the processing gas existing in the processing chamber 101 by an electric field generated by the electromagnetic wave and a magnetic field generated by the magnetic field generating coils 113.

The electrode of the sample stage 108 is supplied with bias power Wv from the bias power supply 116 via a matching device 118. The bias power supply 116 has a CW mode [Continuous Wave] in which the bias power is continuously turned on and a time modulation mode [Time Modulation] in which on/off of a bias is periodically repeated on a millisecond order.

<Example of Use of Hydrogen Element-Containing Gas>

Figure 2:
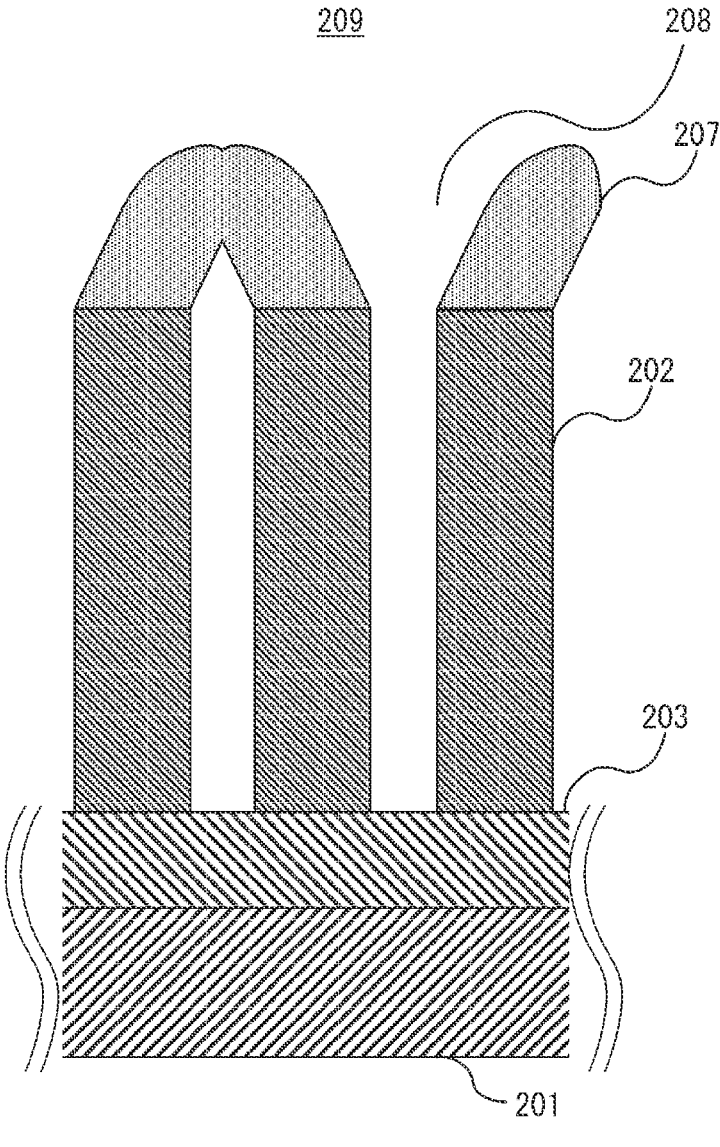
FIG. 2 is a schematic view of formation of a protective film when a gas containing hydrogen is used in the first embodiment according to the invention.

FIG. 2 is a schematic view of formation of a protective film when a gas containing hydrogen is used in the first embodiment. As the processing gas used in the first embodiment, HBr gas having a flow rate three times a total flow rate of a flow rate of $N_2$ gas and a flow rate of $O_2$ gas is introduced into $SiCl_4$ gas, $N_2$ gas, and $O_2$ gas. The source power and the bias power are in the CW mode.

As a result, as shown in FIG. 2, when the thickness of a protective film 207 is more than 15 nm, inclination occurs, and contact within the protective film occurs. It is considered that, since the CW mode is used, the protective film is excessively attached, and the protective film is non-uniformly formed, thereby causing inclination. Although a silicon nitride film 203 can be etched in a step after a protective film forming step, the degree of processing of the silicon nitride film 203 varies due to the contact within the protective film in an opening 208. Although contact between patterns can be prevented by reducing a deposition amount, deposition is limited to about 15 nm in order to avoid the inclination of the protective film. The same result is obtained when $CH_4$ is used as the gas containing hydrogen.

Second Embodiment in the second embodiment, the plasma 119 is generated from a mixed gas of a silicon element-containing gas, an oxygen element-containing gas, a nitrogen element-containing gas, and a hydrogen element-containing gas. Regarding the mixed gas from which the plasma 119 is generated (hereinafter, also referred to as "processing gas"), neutral particles and charged particles including ions and electrons emitted from the plasma 119 may be used as etching species. For example, a reaction gas may be selected from $Cl_2$, HBr, $O_2$, $N_2$, He, Ar, $SiCl_4$, $CH_4$, and the like. The second embodiment is different from the first embodiment in that the bias power supply 116 outputs the bias power in the TM mode. The ions contained in the plasma contribute to an etching reaction together with radicals attached to the processing target substrate 109 while energy is controlled according to power supplied to a wafer. In the description of the second embodiment, the same: or equivalent components as those in the first embodiment are denoted by the same reference numerals, and the description thereof will be simplified or omitted.

Figure 3A:
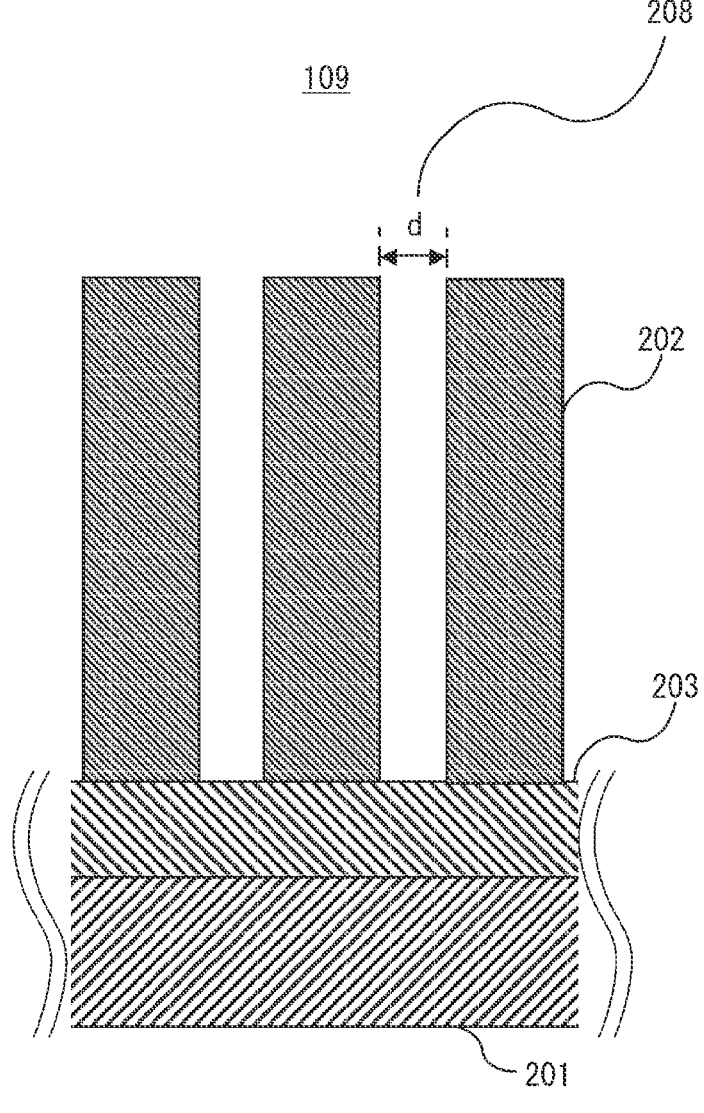
FIG. 3A is a schematic cross-sectional view of a processing target substrate on which a plasma processing method according to a second embodiment of the invention is performed.

Next, a plasma processing method according to the second embodiment of the invention using the plasma processing device 100 will be described with reference to FIGS. 3A to 3C. FIG. 3A is a schematic cross-sectional view of the processing target substrate 109 on which the plasma processing method according to the second embodiment of the invention is performed. In the processing target substrate 109, the silicon nitride film 203 as the etching target film is formed on the wafer substrate 201, and then the mask 202 made of silicon nitride is formed. The pattern of the mask 202 is formed in advance by processing before the processing target substrate 109 is formed. In the embodiment according to the invention, the interval d of the openings 208 in the pattern of the mask 202 is about 15 nm. In the second embodiment, a protective film 204 is silicon oxide or silicon nitride, and silicon contained in the processing gas is a deposition component of the protective film 204.

The plasma processing method according to the invention is performed in a state where the mask is formed on the etching target film. FIG. 3A shows an example in which the etching target film and the mask are formed on a surface of the wafer substrate 201, and the plasma processing method according to the invention can also be applied in a state where the etching target film and the mask are present. In the second embodiment, the etching target film and the mask are made of the same material, and the invention is not limited thereto. For example a material of the etching target film may be silicon oxide, and the material of the mask may be silicon nitride. Alternatively, the material of the etching target film may be silicon nitride, and the material of the mask may be silicon oxide.

Figure 3B:
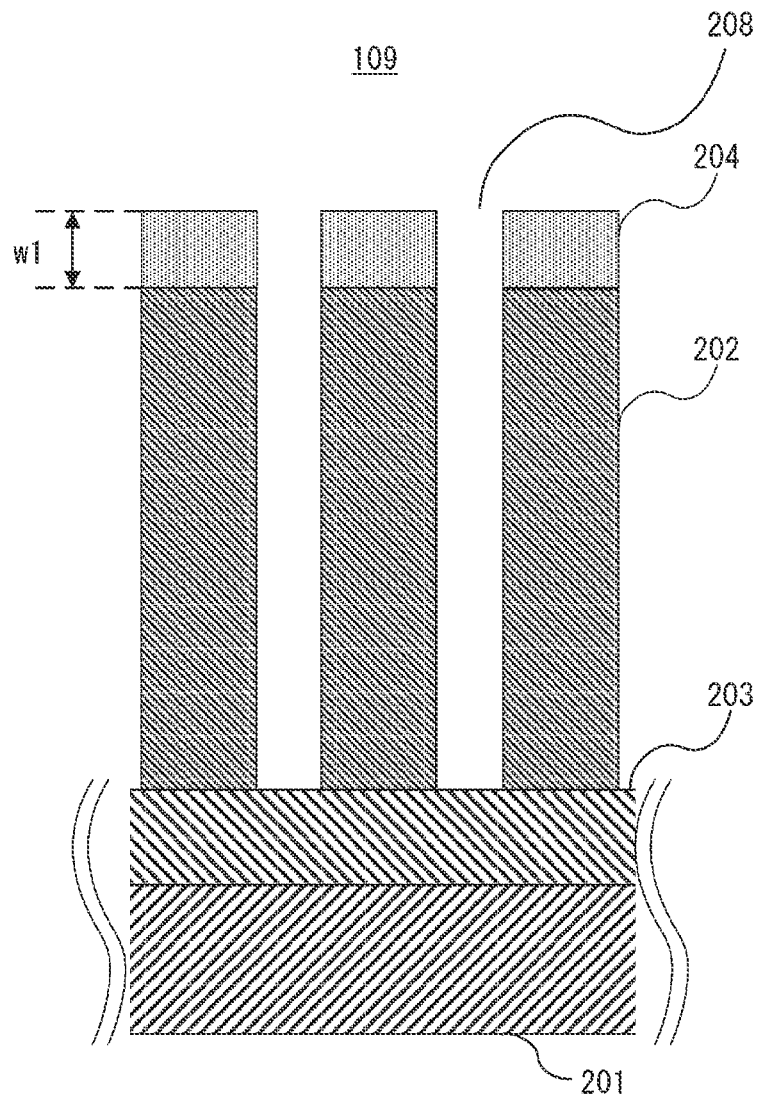
FIG. 3B is a schematic cross-sectional view of a processing target substrate after a protective film forming step in the plasma processing method according to the second embodiment of the invention.

FIG. 3B is a schematic cross-sectional view of the processing target substrate 109 after the protective film forming step in the plasma processing method according to the Second embodiment of the invention. In the protective film forming step, the protective film is formed on the mask using plasma. In the protective film forming step, the protective film is formed while radio frequency power is supplied from the bias power supply 116 to a sample. As shown in FIG. 3B, the protective film 204 having a thickness w1 of about 15 nm is deposited on a surface of the mask 202. Here, the surface refers to a surface parallel to a surface of the wafer substrate 201. Almost no protective film 204 is formed on a side surface of: the mask 202, that is, a surface parallel to a creepage (slope) of the wafer substrate 201. Here, the processing gas is $SiCl_4$ gas, $N_2$ gas, a gas containing oxygen, or a gas containing hydrogen. The gas containing hydrogen is $H_2$ gas, HBr gas, or $CH_4$ gas, and may contain at least one of $H_2$ gas, HBr gas, or $CH_4$ gas. The gas containing oxygen is $O_2$ gas, CO gas, $CO_2$ gas, COS gas, or $SO_2$ gas, and may contain at least one of $O_2$ gas, CO gas, $CO_2$ gas, COS gas, or $SO_2$ gas. Examples of the processing gas include a mixed gas of $SiCl_4$ gas, $O_2$ gas, HBr gas, and $N_2$ gas.

Figure 3C:
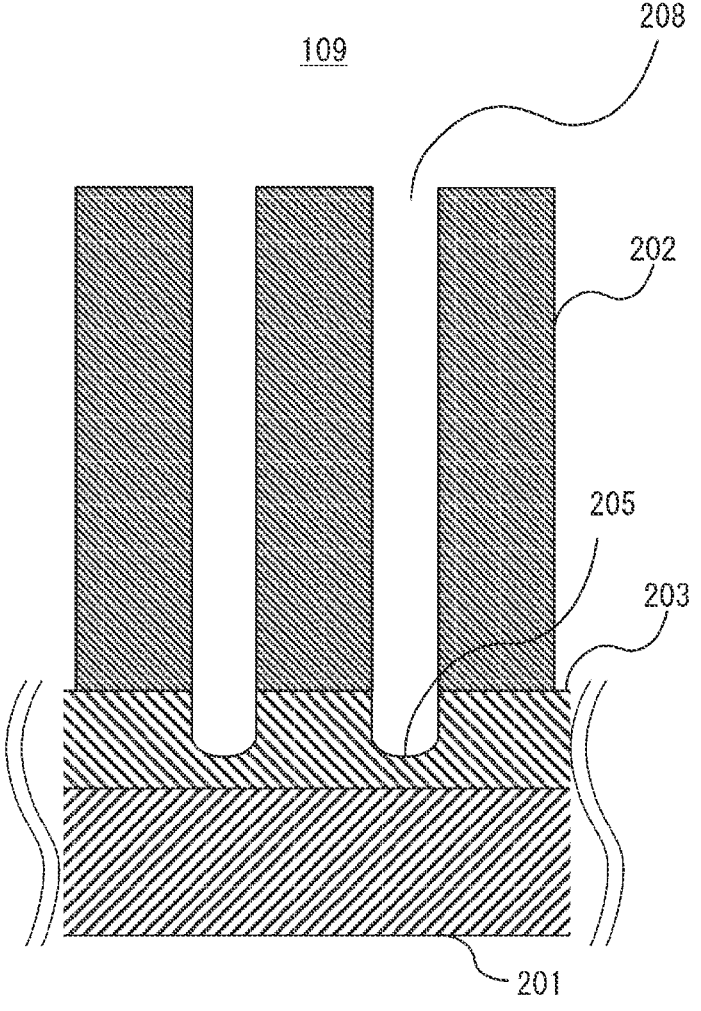
FIG. 3C is a schematic cross-sectional view of the processing target substrate after an etching step in the plasma processing method according to the second embodiment of the invention.

FIG. 3C is a schematic cross-sectional view of the processing target substrate 109 after an etching step in the plasma processing method according to the second embodiment of the invention. The etching step is plasma-etching performed after the protective film 204 having a predetermined thickness is formed. As shown in FIG. 3C, trenches 205 having a predetermined depth are formed in the silicon nitride film 203 as the etching target film. In the second embodiment, $CHF_3$ gas and $O_2$ gas are used as the processing gas for plasma-etching. Although the protective film 204 is also removed by the etching step, since the protective film 204 is formed, the mask 202 is prevented from being etched under the protective film 204.

<Functions and Effects>

Figure 3D:
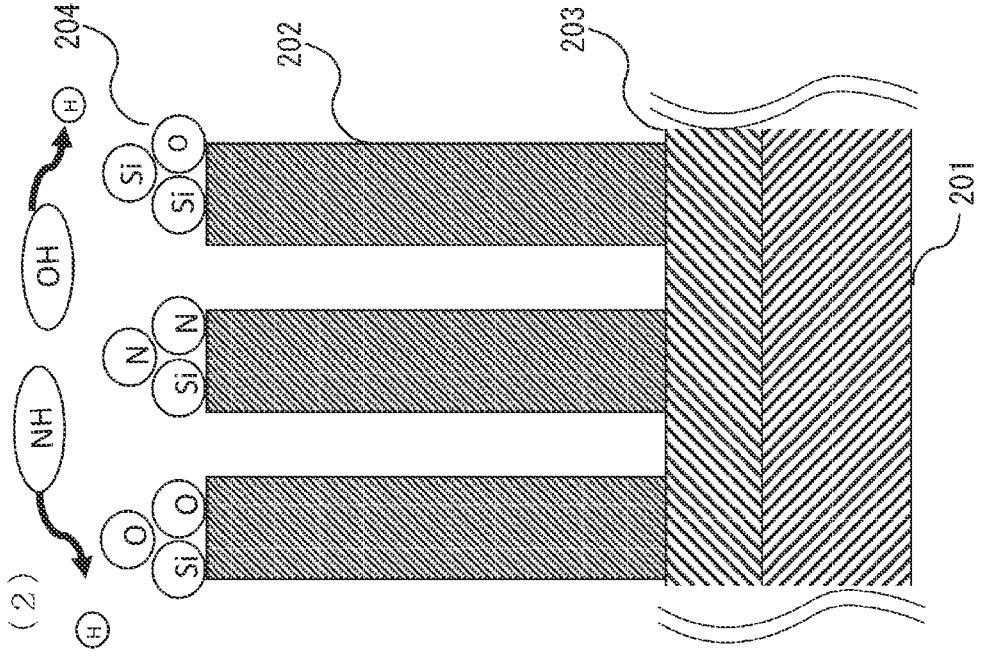
FIG. 3D is a conceptual view showing a mechanism in which a protective film 204 is formed in the second embodiment.
Figure 3D:
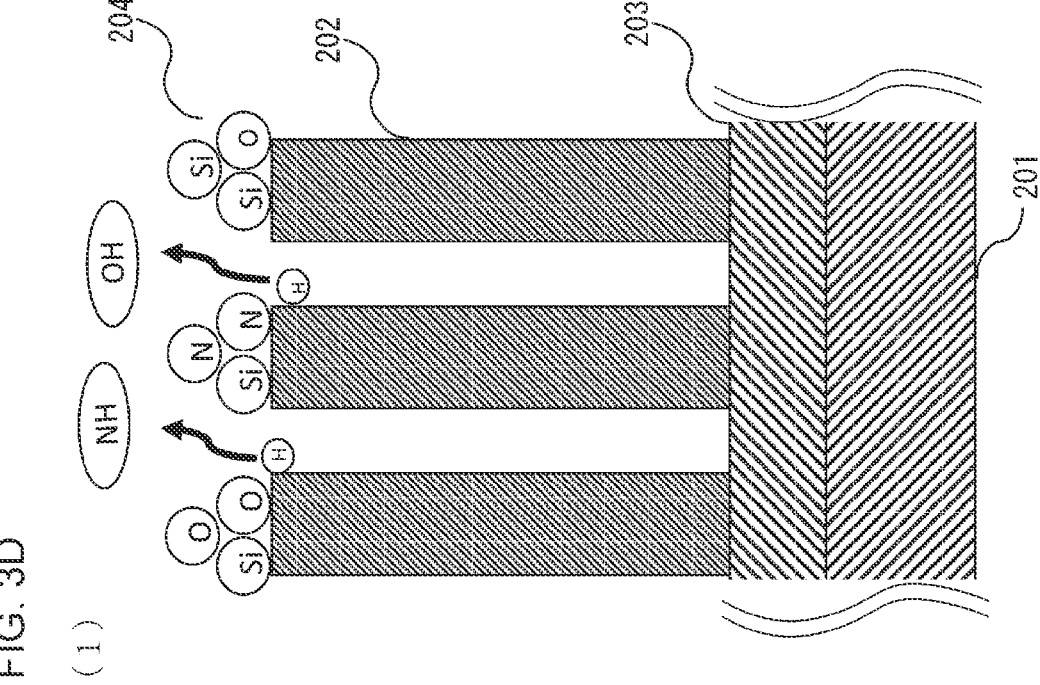

FIG. 3D is a conceptual view showing a mechanism in which a protective film 204 is formed in the second embodiment. An assumed first phenomenon will be described with reference to (1) of FIG. 3D. First, silicon and oxygen or nitrogen that are contained in the processing gas are bonded, and the protective film 204 starts to be deposited on the surface of the mask 202. Meanwhile, it is considered that, in a space portion between the patterns of the mask 202, hydrogen contained in the plasma, which has a smaller atomic radius than an atomic radius of other elements, easily enters, and a large amount of hydrogen stays. The hydrogen staying in the space portion is bonded to N and O, and N and O bonded to silicon are separated. By such a reducing action of hydrogen, growth of the protective film is prevented in relation to the space portion of the mask 202, while the deposition of the protective film proceeds on the surface or the mask 202. Next, an assumed second phenomenon will be described with reference to (2) of FIG. 3D. The N and O bonded to H and separated are re-bonded to H or the like to become stable molecules, and thus are less likely to adhere to a surface of the protective film. It is considered that a synergistic effect of the first phenomenon and the second phenomenon prevents the growth of the protective film in relation to the space portion.

<Time Modulation Mode of Source Power and Bias Power>

In the second embodiment, the source power and the bias power can be set to the time modulation mode.

Figure 4:
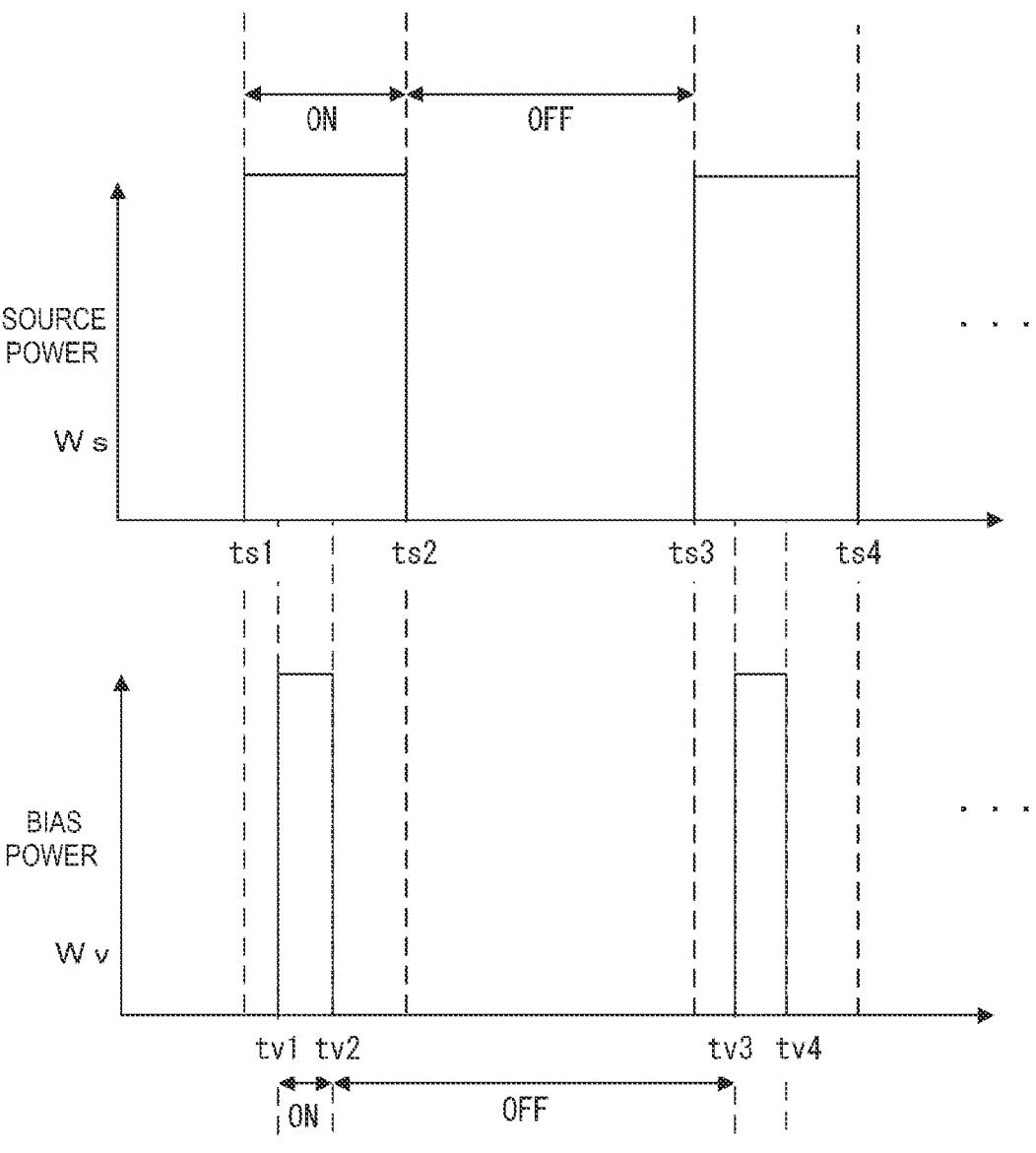
FIG. 4 is a diagram showing a protective film formation condition according to the second embodiment of the invention.

FIG. 4 is a diagram showing a protective film formation condition according to the second embodiment of the invention. The bias power is time-modulated in association with the time modulation of the source power. FIG. 4 shows a relation between an on state and an off state of source power Ws and the bias power Wv. The source power Ws is periodically supplied in a pulsed manner. As shown in FIG. 4, it is periodically supplied such that a period from a time $t_{s1}$ to a time $t_{s2}$ is a period in the on state (hereafter, referred to as "on period"), a period from the time $t_{s2}$ to a time $t_{s3}$ is a period in the off state (hereafter, referred to as "off period"), and a period from the time $t_{s3}$ to a time $t_{s4}$ is the on period. A duty ratio Ds of the source power is $Ds=(t_{s2}-t_{s1})/(t_{s3}-t_{s1})$. In addition, the bias power is also periodically supplied in a pulsed manner, in which a period from a time $t_{v1}$ to a time $t_{v2}$ is an on period, a period from the time $t_{v2}$ to the time $t_{v3}$ is an off period, and a period from the time $t_{v3}$ to a time $t_{v4}$ is an on period. A duty ratio Dv of the bias power is $Dv=(t_{v2}-t_{v1})/(t_{v3}-t_{v1})$. As is clear from FIG. 4, the on periods of the bias power are included in the on periods of the source power, and the duty ratio Dv of the bias power is set to be smaller than the duty ratio Ds of the source power.

As shown in FIG. 4, the bias power Wv is turned on during the on periods of the source power Ws. A frequency of the source power and a frequency of the bias power are set to be the same.

Figure 5A:
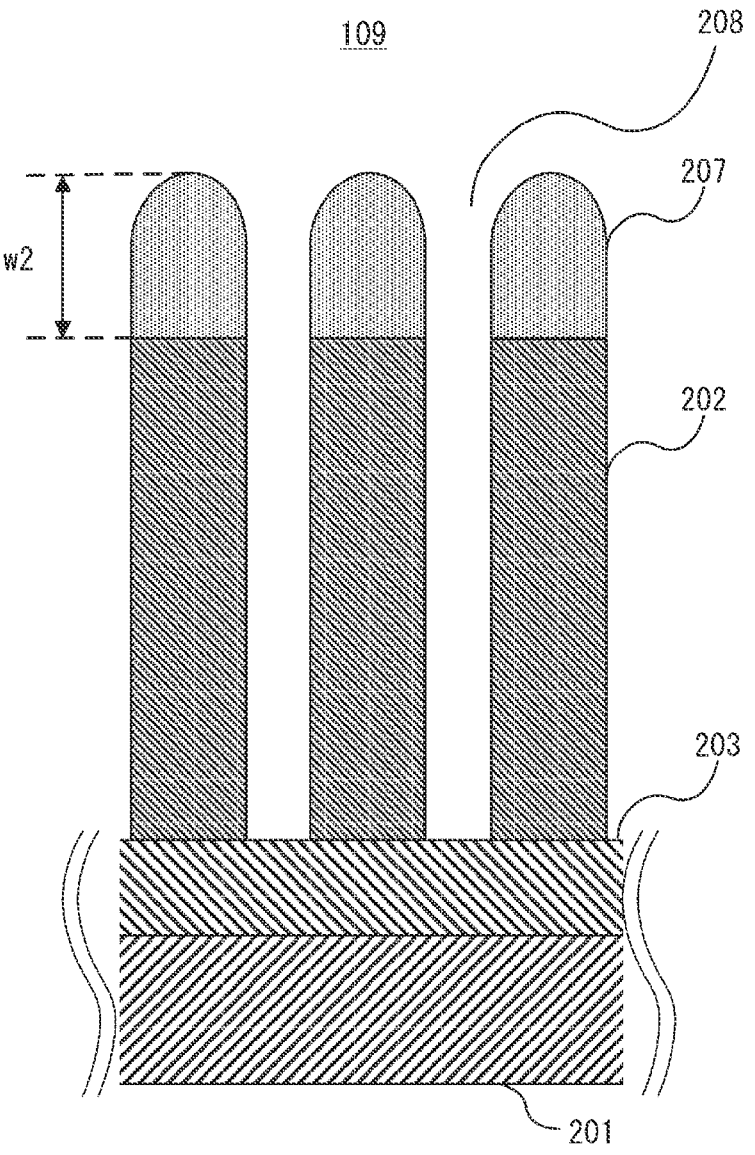
FIG. 5A is a schematic cross-sectional view of the processing target substrate after a protective film forming step in the plasma processing method according to the second embodiment of the invention.

FIG. 5A is a schematic cross-sectional view of the processing target substrate 109 after the protective film forming, step in the plasma processing method according to the second embodiment of the invention. A thickness w2 of the protective film 207 is larger than the thickness w1 of the protective film 204 in the first embodiment, and a protective film having no inclination up to a thickness of about 30 nm can be formed.

<Functions and Effects>

Figure 5B:
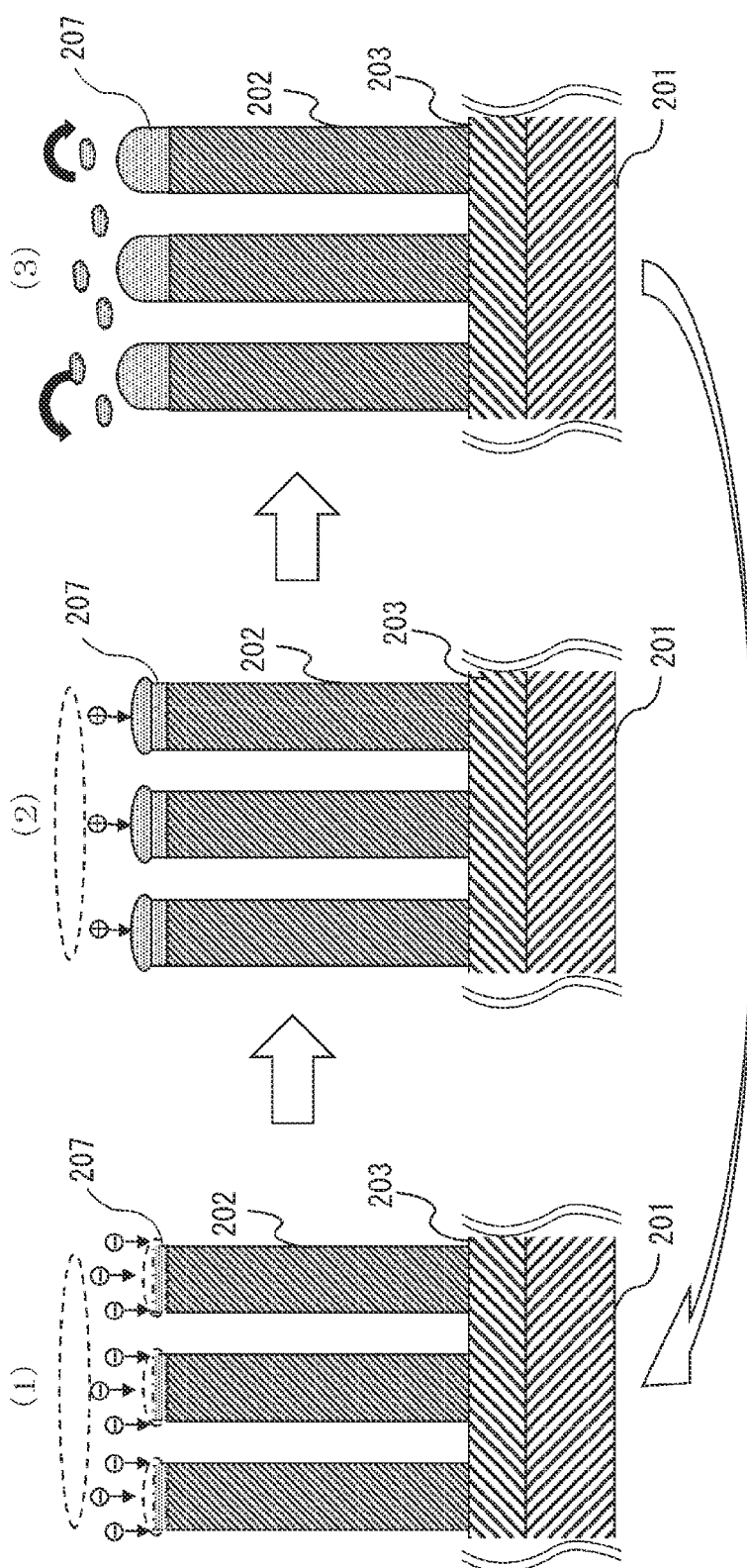
FIG. 5B is a conceptual view showing a mechanism in which a protective film 207 is formed in the second embodiment.

TG. 5B is a conceptual view showing a mechanism in which the protective film 207 is formed in the second embodiment. (1) of FIG. 5B shows a state where the bias power is turned on during a period in which the source power is in the on period and the plasma is generated (for example, the period from $t_{v1}$ to $t_{v2}$ in FIG. 4), and the surface of the protective film 207 is planarized by the ions physically colliding with the protective film 207. (2) of FIG. 5B shows a state where the bias power is turned off during the on period of the source power (for example, a period from $t_{v2}$ to $t_{s2}$ in FIG. 4), and the protective film is isotropically deposited. (3) of FIG. 5B shows a state where the bias power is turned off during the off period of the source power (for example, the period from $t_{s2}$ to $t_{s3}$ in FIG. 4), a formation reaction of the protective film is prevented, and exhaust removal is performed so that a growth direction does not deviate from a vertical direction due to adhesion of an excessive reaction product.

By repeating the three processes, the protective film 207 is formed without inclination. In this case, the time modulation of the source power and the time modulation of the bias power are associated as shown in FIG. 4. In particular, the duty ratio Ds of the source power is set to be larger than the duty ratio Dv of the bias power.

As described above, according to the second embodiment, by preventing the deposition of the protective film in a direction parallel to the substrate surface, blocking the openings 208 of the mask patterns can be improved, and a pattern with a narrow space can be processed with good selectivity.

In the first and second embodiments, the case where the interval d between the mask patterns is 15 nm is described. In a case of 15 nm or less, the plasma processing method according to the invention is suitably applied.

The embodiments described above have been described for easy understanding of the invention, and the invention is not necessarily limited to those including all the configurations described above. A configuration in a certain embodiment can be replaced. It is possible to add, delete, and replace other configurations for a part of the configuration of each embodiment.

The embodiments of the invention are described above, but the invention is not limited to the embodiments described above, and various modifications can be made without departing from the scope of the invention.

For example, in the first embodiment and the second embodiment, the microwave ECR type plasma processing device shown in FIG. 1 is used, but the same effect can also be achieved by adjusting the pressure, gas flow rate, gas ratio, bias power, frequency, or the like in a plasma processing device using other plasma sources such as capacitively coupled plasma (CCP) type and inductively coupled plasma (ICP) type.

REFERENCE SIGNS LIST

100: plasma processing device
101: processing chamber
102: chamber
103: top plate
104: shower plate
105 vacuum exhaust pump
107: control unit
108 sample stage
109: processing target substrate
110: cavity resonance portion
111: chamber
112: waveguide
113: magnetic field generating coil
114: control unit
115: source power supply
116: bias power supply
117, 118: matching device
119: plasma
201: wafer substrate
202: mask
203: silicon nitride film
204, 206, 207: protective film
205: trench
208: opening
209: processing target substrate

The invention claimed is:

1. A plasma processing method for plasma-etching an etching target film using a protective film formed on a mask, the plasma processing method comprising:
   a step of forming the protective film on the mask using plasma generated by a mixed gas of a silicon element-containing gas, an oxygen element-containing gas, a nitrogen element-containing gas, and a hydrogen element-containing gas, wherein
   in the step, the protective film is formed while supplying radio frequency power to a sample on which the etching target film is formed,
   radio frequency power for generating the plasma and the radio frequency power supplied to the sample are pulse-modulated,
   a duty ratio of the radio frequency power supplied to the sample is smaller than a duty ratio of the radio frequency power for generating the plasma, and
   an on period of the radio frequency power supplied to the sample is included in an on period of the radio frequency power for generating the plasma.

2. The plasma processing method according to claim 1, wherein
   the hydrogen element-containing gas is $H_2$ gas, HBr gas, or $CH_4$ gas.

3. The plasma processing method according to claim 1, wherein
   the oxygen element-containing gas is $O_2$ gas, CO gas, $CO_2$ gas, COS gas, or $SO_2$ gas.

4. The plasma processing method according to claim 1, wherein
   a pattern of the mask is a pattern separated at an interval of 15 nm or less.

5. The plasma processing method according to claim 1, wherein the mixed gas is a mixed gas of $SiCl_4$ gas, $O_2$ gas, HBr gas, and $N_2$ gas.

* * * * *